US010871899B2

(12) United States Patent
Tashiro

(10) Patent No.: US 10,871,899 B2
(45) Date of Patent: Dec. 22, 2020

(54) INPUT ACCEPTING DEVICE

(71) Applicant: Kyocera Document Solutions Inc., Osaka (JP)

(72) Inventor: Michiko Tashiro, Osaka (JP)

(73) Assignee: Kyocera Document Solutions Inc., Osaka (JP)

( * ) Notice: Subject to any disclaimer, the term of this patent is extended or adjusted under 35 U.S.C. 154(b) by 0 days.

(21) Appl. No.: 16/270,551

(22) Filed: Feb. 7, 2019

(65) Prior Publication Data

US 2019/0250815 A1 Aug. 15, 2019

(30) Foreign Application Priority Data

Feb. 9, 2018 (JP) ................................ 2018-022062

(51) Int. Cl.

| | |
|---|---|
| ***G06F 3/0488*** | (2013.01) |
| ***G06F 40/129*** | (2020.01) |
| ***G06F 3/01*** | (2006.01) |
| ***G06F 3/023*** | (2006.01) |
| ***H03M 11/00*** | (2006.01) |
| ***G06F 3/02*** | (2006.01) |

(52) U.S. Cl.
CPC .......... *G06F 3/04886* (2013.01); *G06F 3/018* (2013.01); *G06F 3/0219* (2013.01); *G06F 3/0236* (2013.01); *G06F 3/0237* (2013.01); *G06F 40/129* (2020.01); *H03M 11/00* (2013.01)

(58) Field of Classification Search
CPC .... G06F 3/04886; G06F 40/129; G06F 3/018; G06F 3/0236; G06F 3/0237
See application file for complete search history.

(56) References Cited

U.S. PATENT DOCUMENTS

| | | | | |
|---|---|---|---|---|
| 5,778,402 A * | 7/1998 | Gipson | G06F 40/232 | 715/201 |
| 6,356,866 B1 * | 3/2002 | Pratley | G06F 40/53 | 704/9 |
| 2008/0068340 A1 * | 3/2008 | Landschaft | G06F 3/0485 | 345/169 |
| 2012/0149477 A1 * | 6/2012 | Park | G06F 3/0202 | 463/43 |

(Continued)

FOREIGN PATENT DOCUMENTS

JP 2005-301322 A 10/2005

*Primary Examiner* — Nhat Huy T Nguyen
(74) *Attorney, Agent, or Firm* — James Judge

(57) ABSTRACT

An input accepting device includes operation keys, a character receiving unit, a converting unit, an operation key state detection unit, a timer, and a conversion control unit. The converting unit converts a combination of characters corresponding to the operation keys sequentially operated into another character or word. The operation key state detection unit detects a first timing and a second timing while the user operates the operation key. The first timing is at which a state of the user becomes a state of touching the operation key from a state of not touching the operation key. The second timing is at which a state of the user becomes a state of not touching the operation key after the first timing. The timer detects an elapsed time from the first timing. The conversion control unit causes the conversions with different contents depending on the elapsed time at the second timing.

4 Claims, 13 Drawing Sheets

(56) References Cited

U.S. PATENT DOCUMENTS

| | | | | |
|---|---|---|---|---|
| 2013/0249929 | A1* | 9/2013 | Osada | G06F 40/109<br>345/589 |
| 2015/0012867 | A1* | 1/2015 | Yoon | G06F 3/0233<br>715/773 |

* cited by examiner

COMPARATIVE EXAMPLE

明日は、てんき
　　　　⎴
　　　　C6
C5

| 1 | 2 | 3 | 4 | 5 | 6 | 7 | 8 | 9 | 0 |
|---|---|---|---|---|---|---|---|---|---|
| Q | W | E | R | T | Y | U | I | O | P |
| A | S | D | F | G | H | J | K | L | + |
| Z | X | C | V | B | N | M | < | > | ? |

| | Kana Character |
|---|---|
| | Kana String |
| C5 | き |
| C6 | てんき |

COMPARATIVE EXAMPLE

| | | |
|---|---|---|
| C1 | 明日は、 | Character String |
| C7 | 天気 | Kanji String |
| C12 | 明日は、天気 | Phrase |

INPUT ACCEPTING DEVICE

INCORPORATION BY REFERENCE

This application is based upon, and claims the benefit of priority from, corresponding Japanese Patent Application No. 2018-022062 filed in the Japan Patent Office on Feb. 9, 2018, the entire contents of which are incorporated herein by reference.

BACKGROUND

Unless otherwise indicated herein, the description in this section is not prior art to the claims in this application and is not admitted to be prior art by inclusion in this section.

A personal computer and various kinds of mobile devices, such as a mobile phone and a smart phone, use a keyboard and operation keys (such as a touch panel). A user can input characters by pressing (or touching) each of keys on these keyboard and operation keys. This ensures performing operations such as making and outputting a composition and transmitting the composition through an e-mail. Here, for example, when Japanese is input on a romaji input keyboard, the input is not confirmed at the moment at which the key is pressed. For example, when a specific kanji character is to be input, keys of a vowel "U" and a vowel "E" are sequentially pressed, and then, a corresponding kana character string is tentatively displayed. Then, pressing an operation key (such as space key) for a conversion operation into a kanji character displays a plurality of kanji character candidates. Then, operating on a confirmation key (such as enter key) with an appropriate kanji character being selected duly confirms the input.

For example, when the operation keys are small and adjacent operation keys are close as in, for example, a smart phone, it is highly probable that the user erroneously touches an operation key adjacent to a desired operation key. In order for the user to easily detect such an erroneous operation, for example, it is set that a detection of one operation key having been operated (for example, key "U" being operated) is made not at a time point at which this operation key is touched, but at a time point at which a finger is released from this operation key after the finger has touched this operation key for a predetermined short period of time.

There has been proposed a technique in which, when a small operation key is touched when such a behavior is caused, a character corresponding to this operation key and characters corresponding to operation keys adjacent to this operation key are tentatively displayed as candidates, and when the finger is released from this operation key, an input of the character corresponding to this operation key is confirmed. This ensures a further reduced improper operation by the user and a reduced count of necessary operations, thereby ensuring enhanced durability of the device.

SUMMARY

An input accepting device according to one aspect of the disclosure includes a plurality of operation keys, a character receiving unit, a converting unit, an operation key state detection unit, a timer, and a conversion control unit. The plurality of operation keys correspond to mutually different characters. The character receiving unit receives characters by operation of the operation key by a user. The converting unit converts a combination of characters corresponding to the operation keys sequentially operated into another character or word. The operation key state detection unit detects a first timing and a second timing while the user operates the operation key. The first timing is at which a state of the user becomes a state of touching the operation key from a state of not touching the operation key. The second timing is at which a state of the user becomes a state of not touching the operation key after the first timing. The timer detects an elapsed time from the first timing. The conversion control unit causes the conversions with different contents depending on the elapsed time at the second timing.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1:
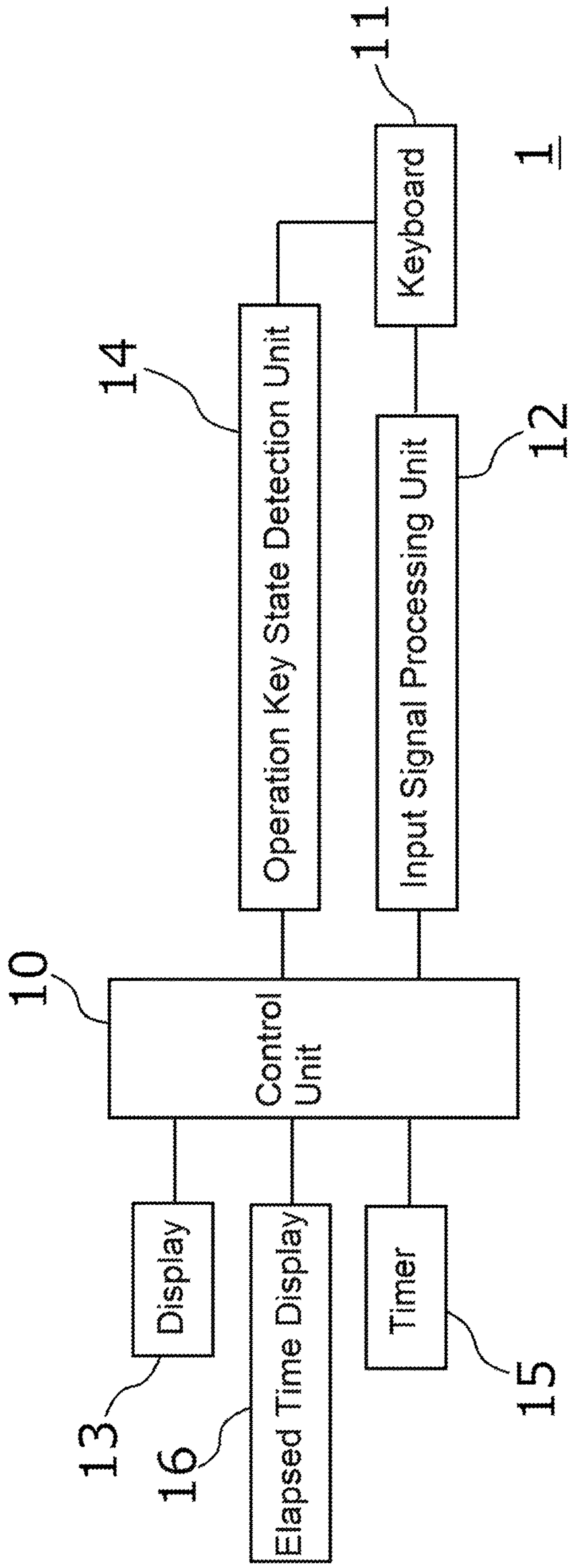
FIG. 1 illustrates a block diagram illustrating a configuration of an input accepting device (personal computer) according to one embodiment of the disclosure.

Example apparatuses are described herein. Other example embodiments or features may further be utilized, and other changes may be made, without departing from the spirit or scope of the subject matter presented herein. In the following detailed description, reference is made to the accompanying drawings, which form a part thereof.

The example embodiments described herein are not meant to be limiting. It will be readily understood that the aspects of the present disclosure, as generally described herein, and illustrated in the drawings, can be arranged, substituted, combined, separated, and designed in a wide variety of different configurations, all of which are explicitly contemplated herein.

The following describes a configuration to execute the disclosure with reference to the drawings. The input accepting device of the embodiment includes a keyboard. The input accepting device of the embodiment is a personal computer 1 to which characters are input by a keyboard operation by a user, and FIG. 1 illustrates a simplified configuration of the personal computer 1. In practice, while this personal computer 1 also includes components (for example, memory and hard disk) that are not illustrated in FIG. 1, the components inherently unrelated to the disclosure are omitted in FIG. 1.

This personal computer 1 uses a keyboard 11 having arrays of many operation keys. This keyboard 11 is configured to input Japanese using a romaji input method. An input signal processing unit 12 determines whether each of operation keys on the keyboard 11 has been operated or not, and transmits specifically which operation key has been operated to a control unit 10 (CPU).

This causes the control unit (conversion control unit) 10 to detect contents (for example, composition formed in characters) input by the user, and perform operations, such as changing the contents into an electronic file to store the file in a memory and a hard disk, or further transmitting this electronic file via a network. At this time, the control unit 10 also performs an operation to convert romaji characters or a combination of romaji characters corresponding to operated operation keys into Japanese characters (kana characters, kanji characters). There is located a display 13 as a display to display the character detected by the control unit 10 or the character after being converted as described above by operating the operation key. Here, a character that is not yet confirmed is tentatively displayed as well as a character that has been confirmed as an input.

Here, an operation key state detection unit 14 that detects in detail a state of the operation key while being operated is located. While each of the operation keys is operated on the keyboard 11, there exist a first timing and a second timing. The first timing is a timing at which a state of the user (user's finger) transitions to a state of touching this operation key from a state of not touching this operation key. The second timing is a timing at which a state of the user transitions to a state of not touching this operation key again after the first timing. The operation keys are connected to an electrical switch, and therefore, the operation key state detection unit 14 is configured to electrically detect the first timing and the second timing. When the first timing is detected for a certain operation key, the control unit 10 can determine that this operation key is operated.

There is locate a timer 15 that counts an elapsed time from the first timing. This ensures causing the control unit 10 to detect the elapsed time from the first timing at the second timing on this operation key in addition to which operation key is operated. This elapsed time is measured at every single operation.

Here, there are the first timing and the second timing as timings for the control unit 10 to perform conversion behaviors. At this time, contents of the conversion behavior performed at the second timing differ depending on the elapsed time at the second timing. Since the contents of the conversion behavior thus differ depending on the elapsed time at the second timing, an elapsed time display 16 that displays the current elapsed time for the user is located together with the display 13. Here, a proportion of this elapsed time with respect to a preliminarily set time (standby time) is displayed. Switching the above described conversion behaviors is also performed depending on a value of this proportion at the second timing in practice. The elapsed time display 16 and the display 13 can be achieved using different regions on a single display.

It should be noted that in the above-described configuration, the keyboard 11 has a plurality of mechanically movable operation keys that are configured to be physically arrayed, and is located in a separate body from the display 13 and the elapsed time display 16. However, the display 13 and the elapsed time display 16 may be touch panel displays, and similar operation keys may be virtually arrayed and displayed in the touch panel displays. When the user touches a portion corresponding to a certain operation key with his finger in this virtual array (on-screen keyboard), the input signal processing unit 12 detects a position touched by the finger, and thus ensuring detecting that this operation key is pressed as well. In this case, it is assumed that the display 13, the elapsed time display 16, and the keyboard 11 are integrated in practice, and the control described below can be performed similarly.

Figure 2:
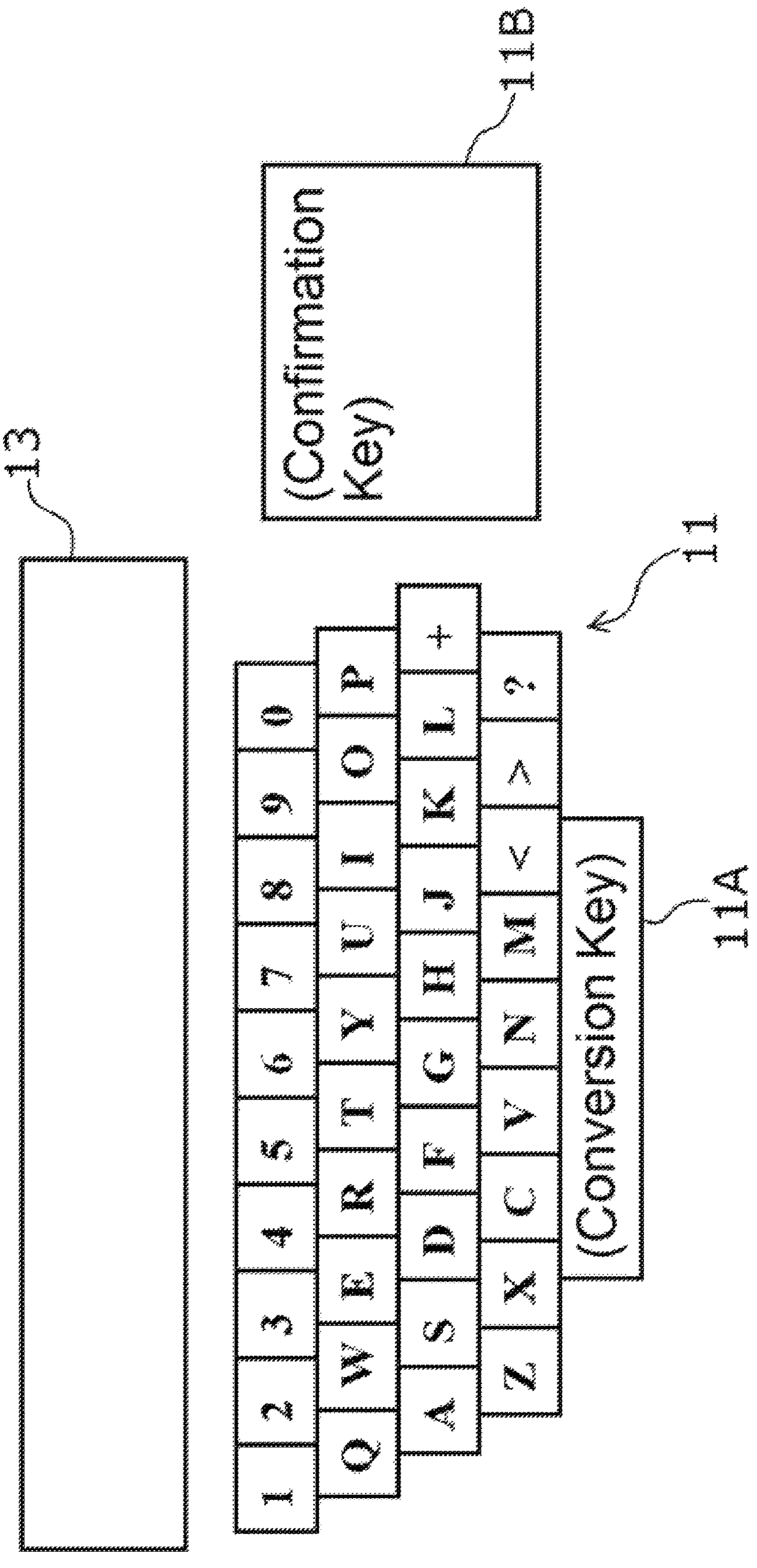
FIG. 2 illustrates an exemplary configuration of a keyboard used in the input accepting device according to the one embodiment.

FIG. 2 illustrates the arrays (part) of each operation key and the display 13 on the keyboard 11. Here, the keyboard 11 has an upper side where the display 13 that can display a composition of one line or more is used. Here, romaji character in Japanese characters is to be input. An operation key (conversion key 11A) to cause a conversion from kana characters to kanji characters is located in a lower side, and an operation key (confirmation key 11B) for confirming selected kanji characters thereafter is located in a right side.

First, for comparison, a procedure in a typical method while characters are input in this case will be described. FIGS. 3A to 3D describe comparative examples where a phrase (C12, see FIG. 3D) is input in this case where the keyboard 11 having a configuration in FIG. 2 is used. Here, the operation key operated on the keyboard 11 is illustrated in a hatched manner. It should be noted that a timing to detect each of the operation keys is operated can be a time point at which the finger is released after a certain short period of time elapses since each of the operation keys is pressed with the finger as described above. However, even when a time point at which each of the operation keys is pressed is detected as this timing, a similar behavior can be caused.

Figure 3A:
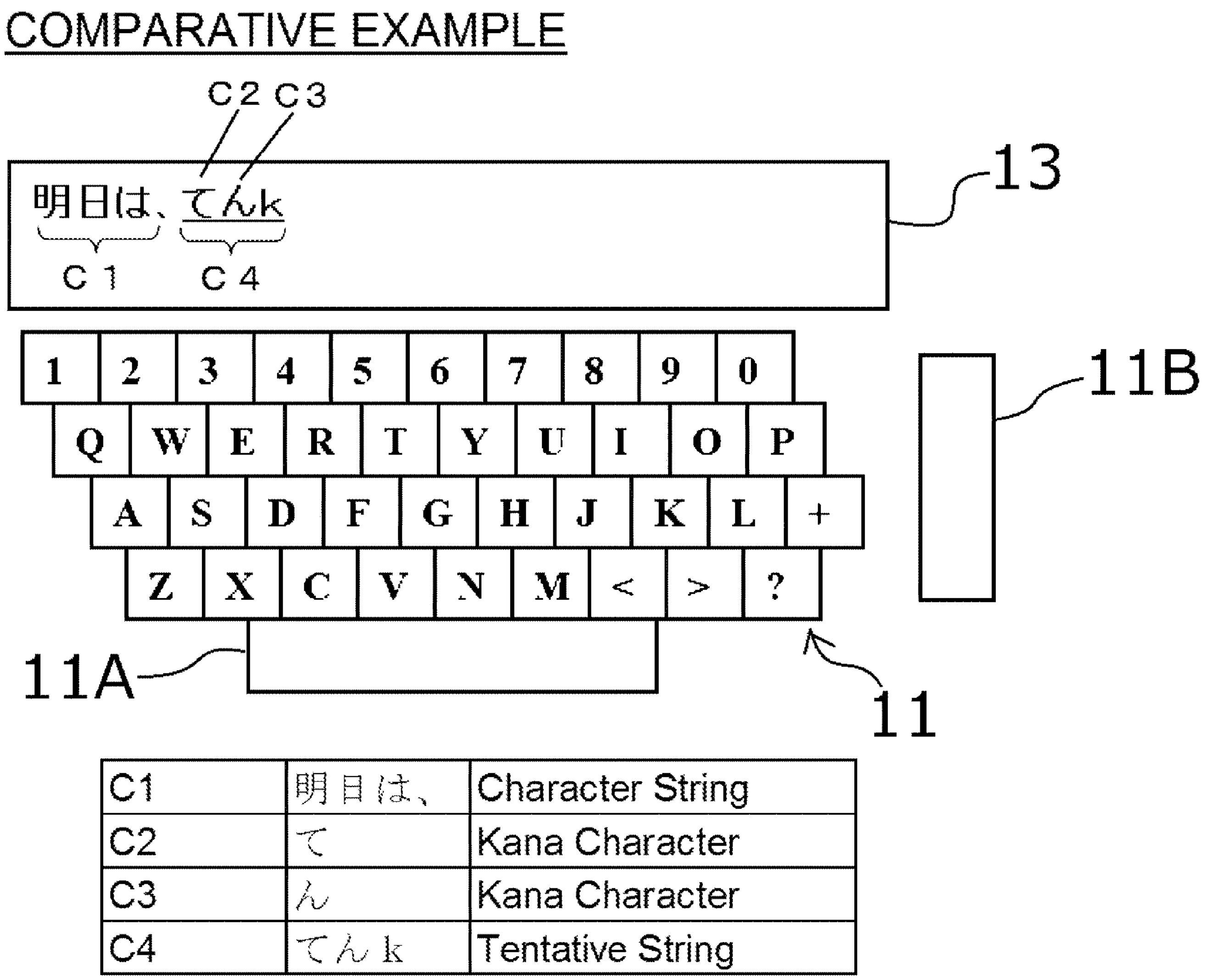
FIGS. 3A to 3D illustrate exemplary behaviors in a typical input accepting device.

In FIG. 3A, up to a character string (C1) in this phrase is confirmed, and FIG. 3A illustrates a procedure to input a subsequent kanji character string (C7). In this case, as illustrated in FIG. 3A, while keys "T," "E," "N," and "K" are sequentially operated, at a time point at which a vowel "E" is operated, "T" and "E" are automatically converted into a kana character (C2), and "N" is automatically converted into a kana character (C3) when a consonant "K" is operated. Since a character succeeding "K" is not yet input, as illustrated in FIG. 3A, "K" is not confirmed in a state of a tentative string (C4) on the display 13. The tentative string (C4) has an underline that indicates this is in an unconfirmed state and tentatively displayed.

Figure 3B:
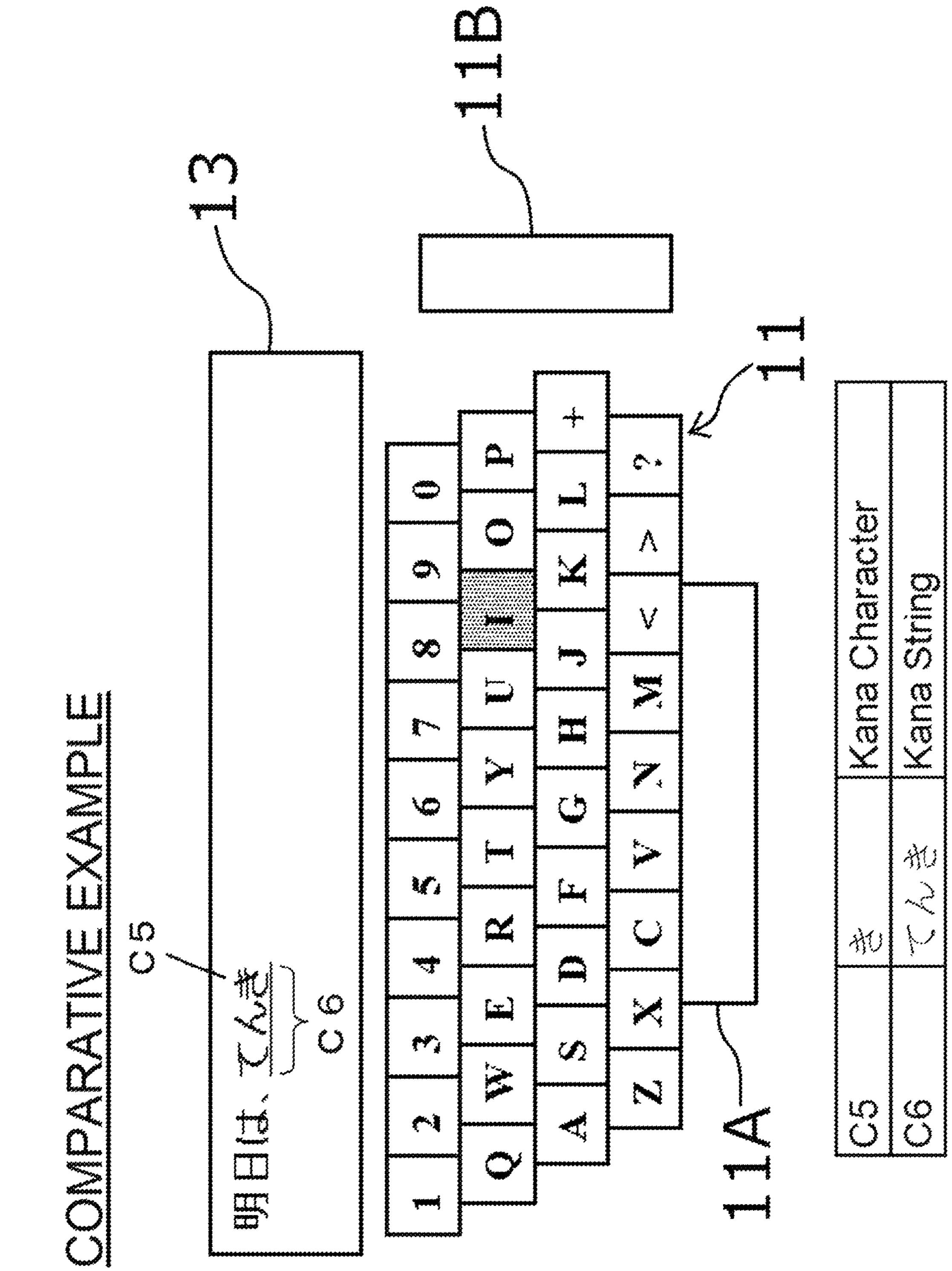
Figure 3C:
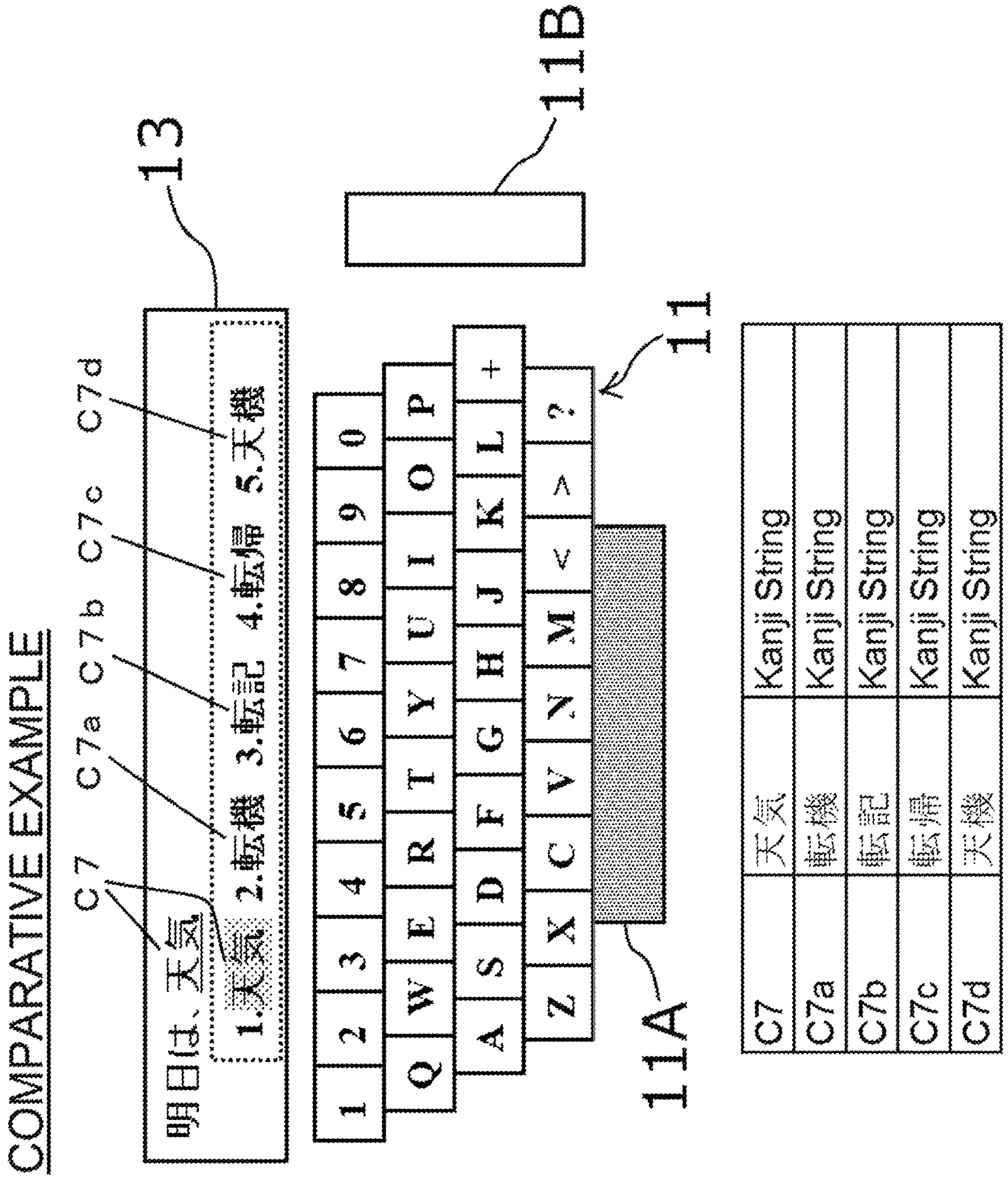

Thereafter, as illustrated in FIG. 3B, when the user operates "I," "K" and "I" are automatically converted into a kana character (C5), and then a kana character string (C6) newly becomes a tentatively display and displayed with the underline. Thereafter, as illustrated in FIG. 3C, operating the conversion key 11A converts the kana character string (C6) into the kanji character string (C7) as a first candidate, and the kanji character string (C7) is tentatively displayed. However, since this state is still in the unconfirmed state, similarly to the state in FIG. 3B, the kanji character string (C7) is displayed with the underline, and simultaneously, other candidates, a kanji character string (C7*a*), a kanji character string (C7*b*), a kanji character string (C7*c*), and a kanji character string (C7*d*) are also displayed in another frame. When the user desires the kanji character string (C7*a*) instead of desiring the kanji character string (C7), operating the conversion key 11A again or moving a cursor to the kanji character string (C7*a*) in the other frame displays the kanji character string (C7*a*) instead of the above-described kanji character string (C7).

Figure 3D:
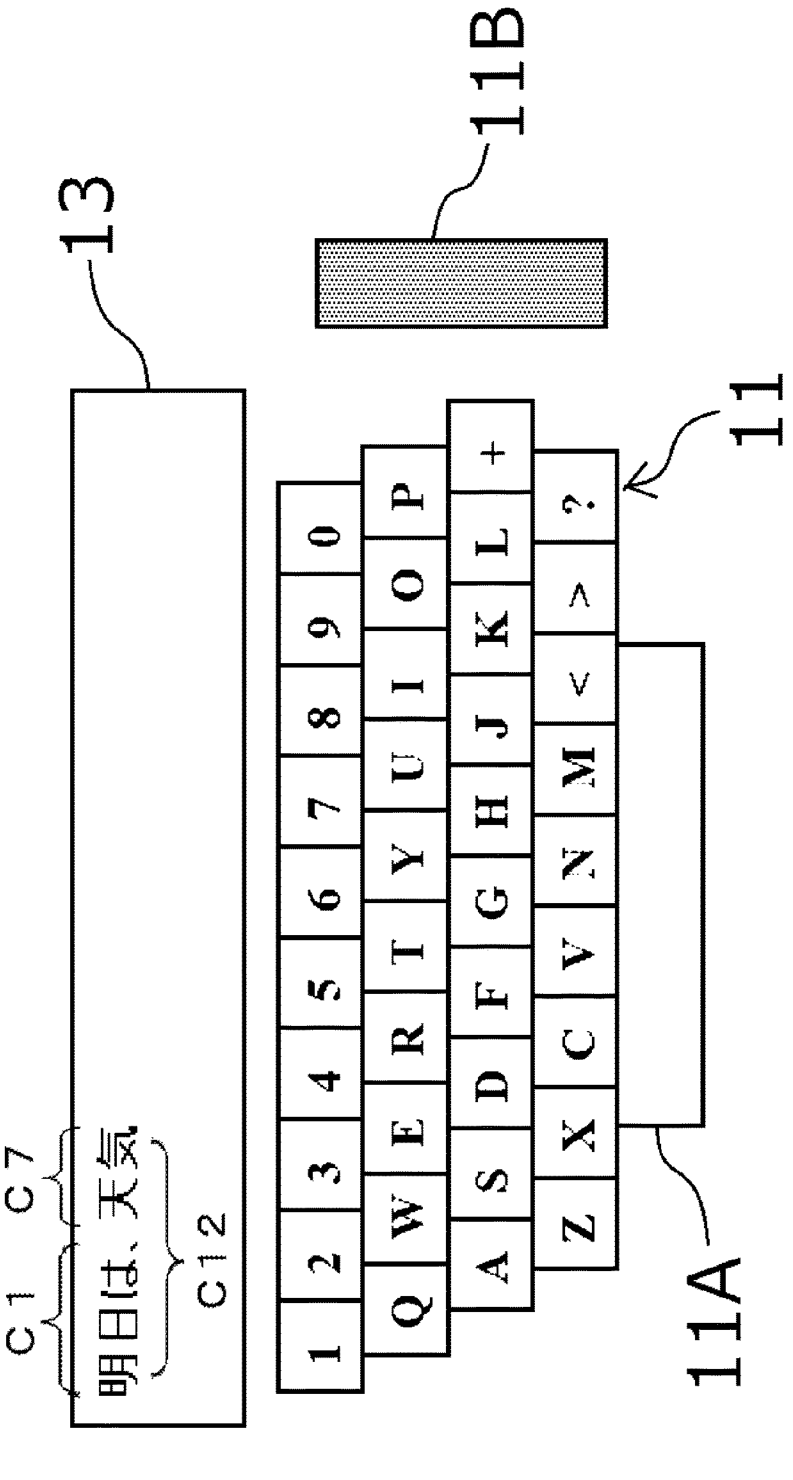

Here, when the kanji character string (C7) is desired, then, as illustrated in FIG. 3D, the user operating the confirmation key 11B removes the displayed underline below the kanji character string (C7), and the kanji character string (C7) is confirmed similarly to the character string (C1) therebefore. This confirms the input of the phrase (C12).

In the above-described operations, the timing at which the input signal processing unit 12 detects that each of the operation keys (in the above-described example, for example, "T," "E," and conversion key 11A) is operated can be the time point at which the finger is released after the certain period of short time elapses since each of the operation keys are pressed with the finger as described above.

Next, a description will be given of a behavior of the input signal processing unit 12 in the above-described personal computer 1 while characters are input similar to above is performed based on FIGS. 4A to 4E. In the examples in FIGS. 3A to 3D, the timing to detect that the operation key is operated to cause each behavior can be the time point at which the finger is released after each of the operation keys is pressed with the finger or the time point at which each of the operation keys is pressed with the finger. In contrast to this, in this personal computer 1, the operation key state detection unit 14 detects both the first timing (time point at which operation key is pressed) and the second timing (time point at which finger is released after operation key is pressed). In FIGS. 4A to 4E, while each of the operation keys is pressed, this operation key is illustrated surrounded by a bold line, and the time point (second timing) at which the finger is released from this operation key thereafter is illustrated hatched similarly to FIGS. 3A to 3D.

On the elapsed time display 16, an elapsed time from the first timing is illustrated in a pie chart as a proportion with respect to a preliminarily set standby time. These proportions are illustrated as hatched regions in the pie charts in FIGS. 4A to 4E. However, in practice, a common display or a touch panel display may be used for the display 13 and the elapsed time display 16. The display of the elapsed time display 16 can be displayed at a position separated from the display of the character targeted for the current control among the displays on the display 13.

Figure 4A:
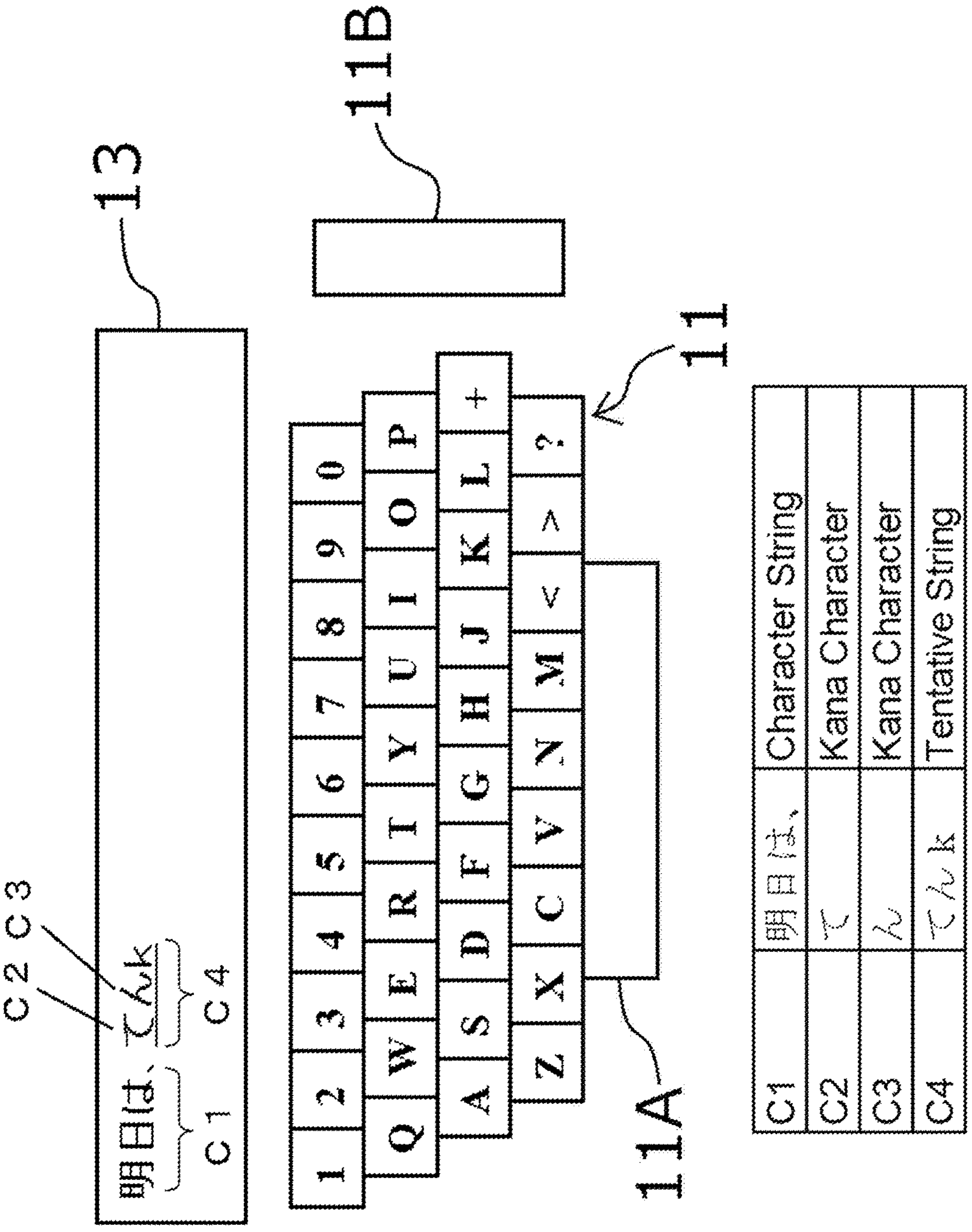
FIGS. 4A to 4F illustrate exemplary behaviors in the input accepting device according to the one embodiment.
Figure 4B:
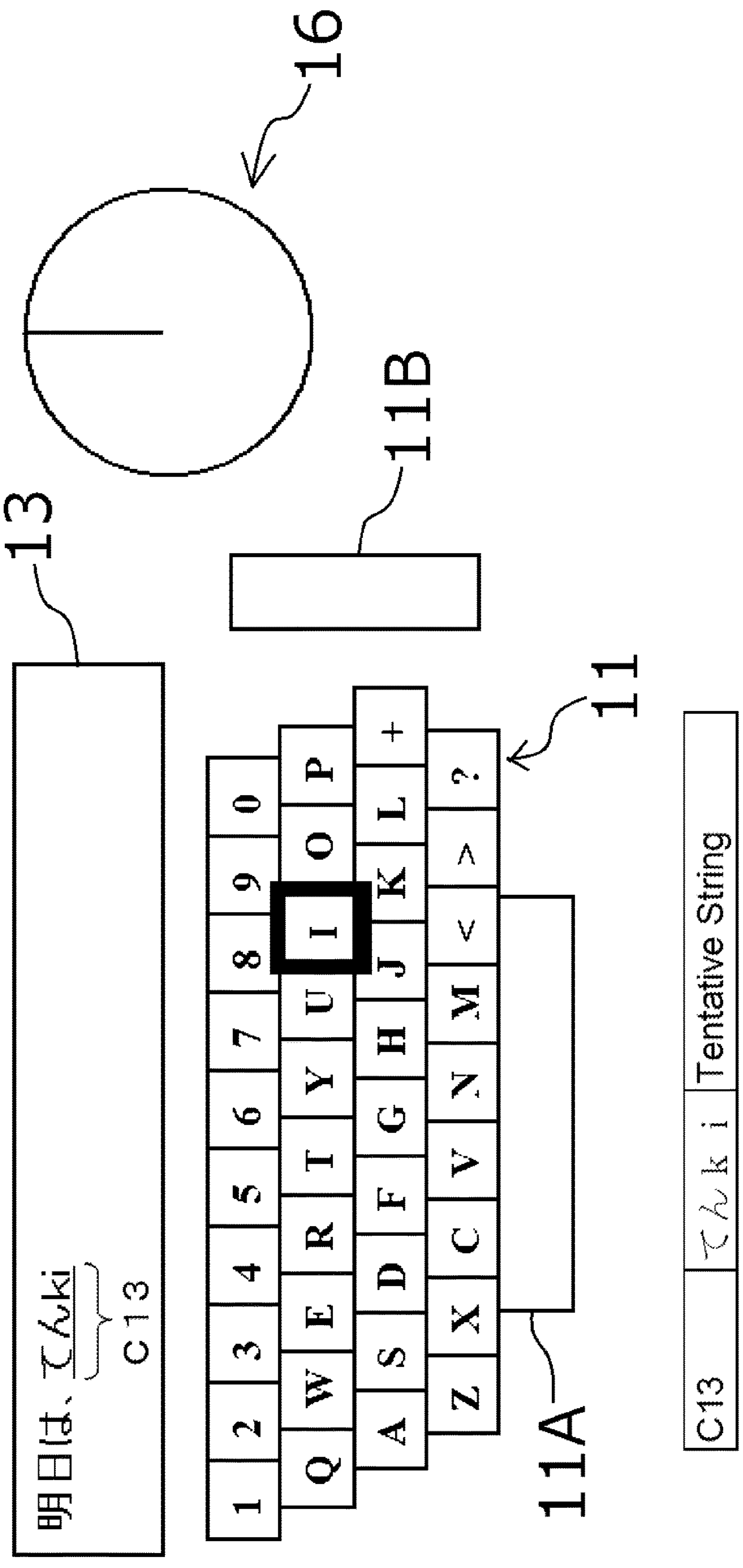

FIG. 4A illustrates a state identical to the state in FIG. 3A, that is, illustrates a state before inputting "I" before confirming the kana character (C5) by "K" and "I" in the kana character string (C6). FIG. 4B illustrates a state immediately after the user pressing "I" from this state (first timing). In this input accepting device 1, at a time point at which "I" is pressed, a character corresponding to this is input, and thus, it is tentatively displayed in a state of a tentative string (C13). On the elapsed time display 16, an elapsed time (above-described proportion) is displayed as zero.

Figure 4C:
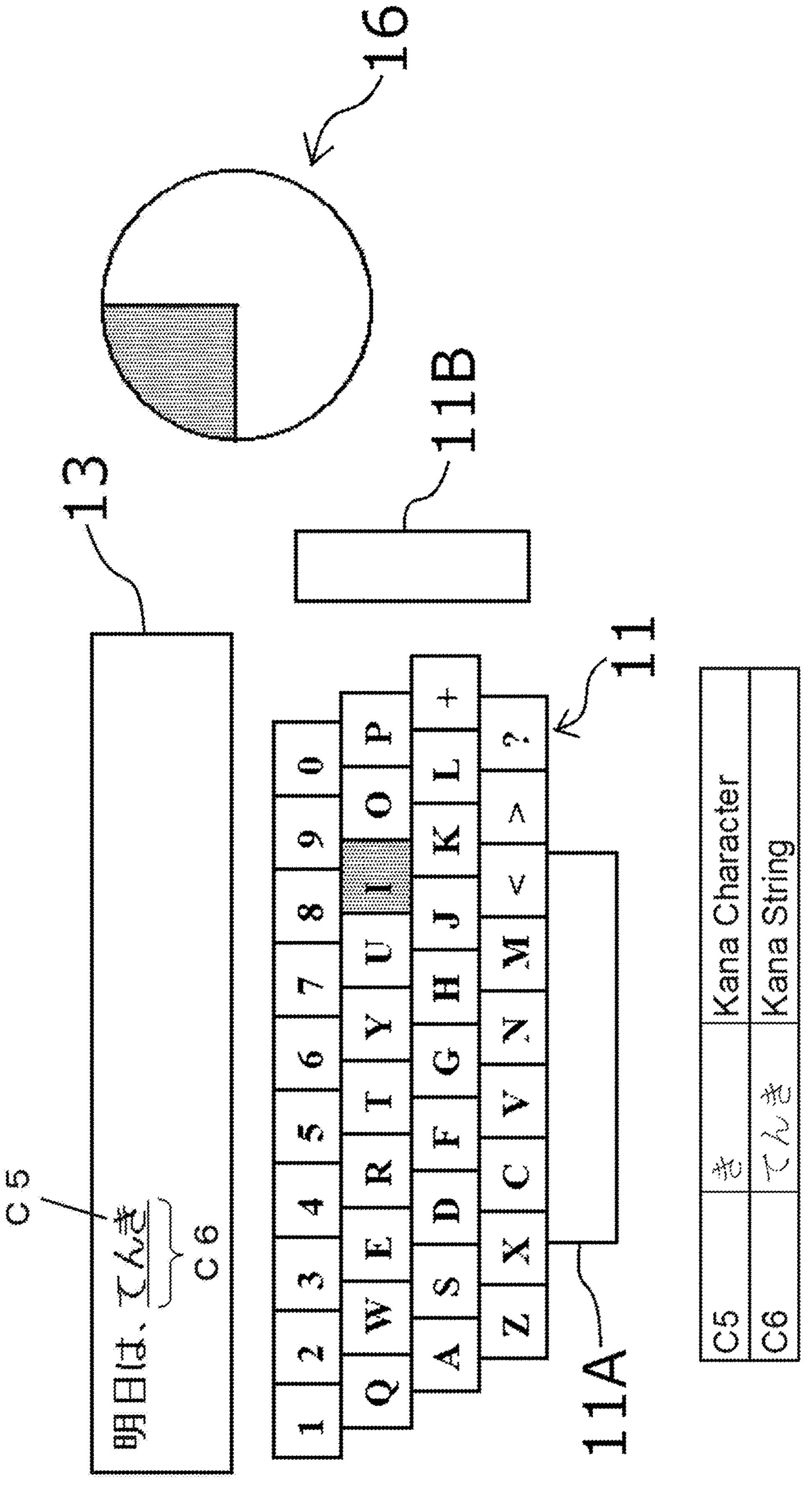

The finger being released from the operation key ("I") pressed at this time and the second timing being detected causes the next behavior. The behavior performed at this time differs depending on the above-described elapsed time at this time point. FIG. 4C illustrates a behavior (first conversion behavior) when the finger is released in a short elapsed time. Here, the elapsed time at this time point is a quarter of the standby time. In the pie chart, the hatched portion corresponds to the elapsed time and the white portion corresponds to the remaining time. In this state, similarly to FIG. 3B, the kana character (C5), which is a corresponding converted kana character of the above-described inputs "K" and "I," is tentatively displayed with the underline.

Figure 4D:
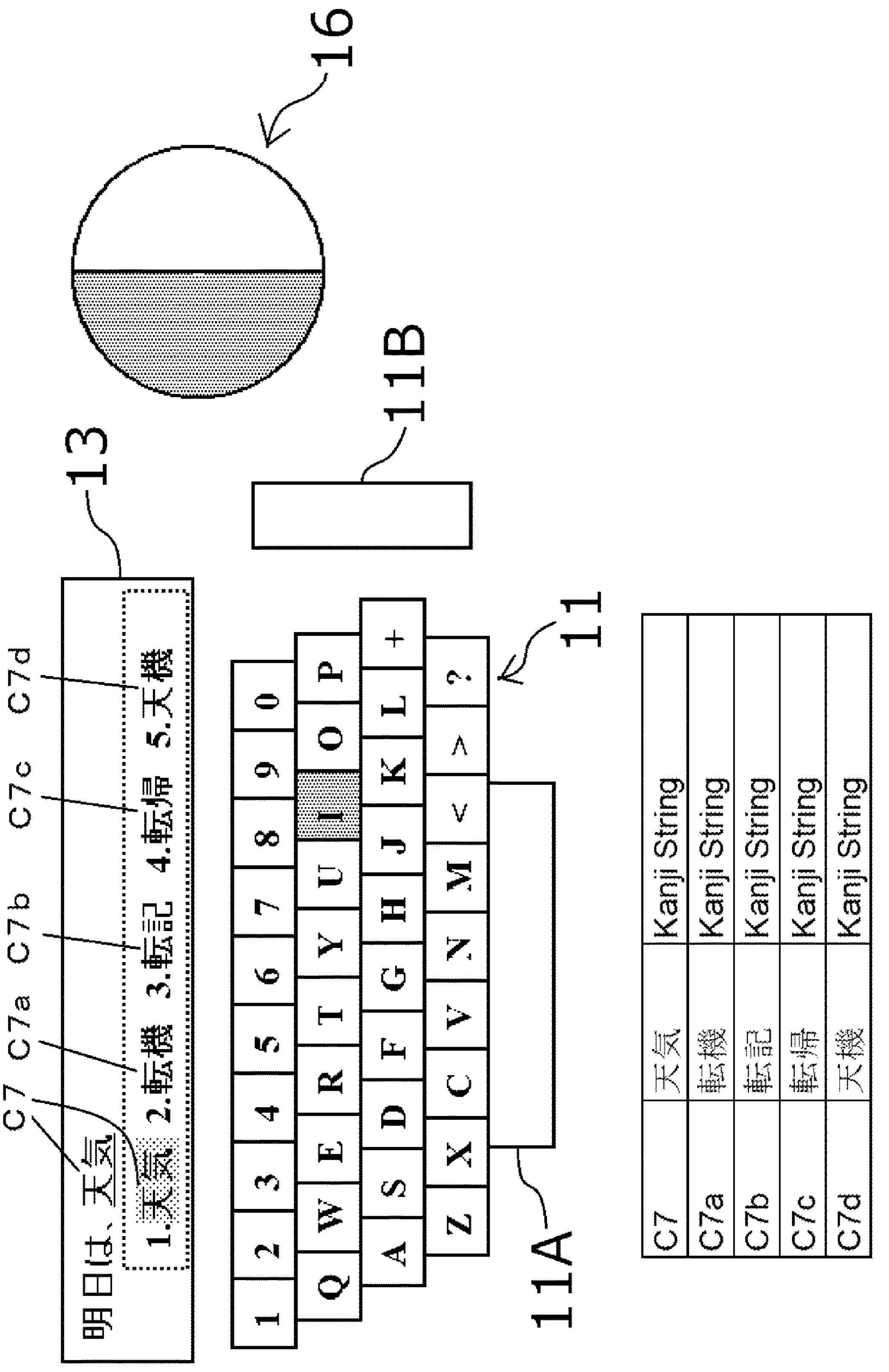

Meanwhile, FIG. 4D illustrates a behavior (second conversion behavior) when the elapsed time in the second timing is long (half of standby time). Here, similarly to FIG. 3C, the kanji character string (C7) is tentatively displayed. The kanji character string (C7) is the kanji converted kana character string (C6), which becomes an unconfirmed portion when the kana character (C5) by "K" and "I" are input. It is also similar that the other candidates, the kanji character string (C7*a*), the kanji character string (C7*b*), the kanji character string (C7*c*), and the kanji character string (C7*d*) are selectably displayed in the other frame.

Thus, in this input accepting device 1, the control unit 10 causes different conversion behaviors depending on time period from the user pressing the operation key to releasing the operation key. Here, the operation of the conversion key 11A needed in the examples in FIGS. 3A to 3D to provide the state similar to the state in FIG. 4D is not necessary. In some cases, when the user desires to output the state in FIG. 4C, it is only necessary that the user quickly releases his finger from the key "I." The user can recognize this timing by looking at the elapsed time display 16. In view of this, it is preferred to change colors of a whole pie chart or the hatched portion in the pie chart in the elapsed time display 16 for, for example, the timing that causes the conversion behavior in FIG. 4C and the timing that causes the conversion behavior in FIG. 4D.

Figure 4E:
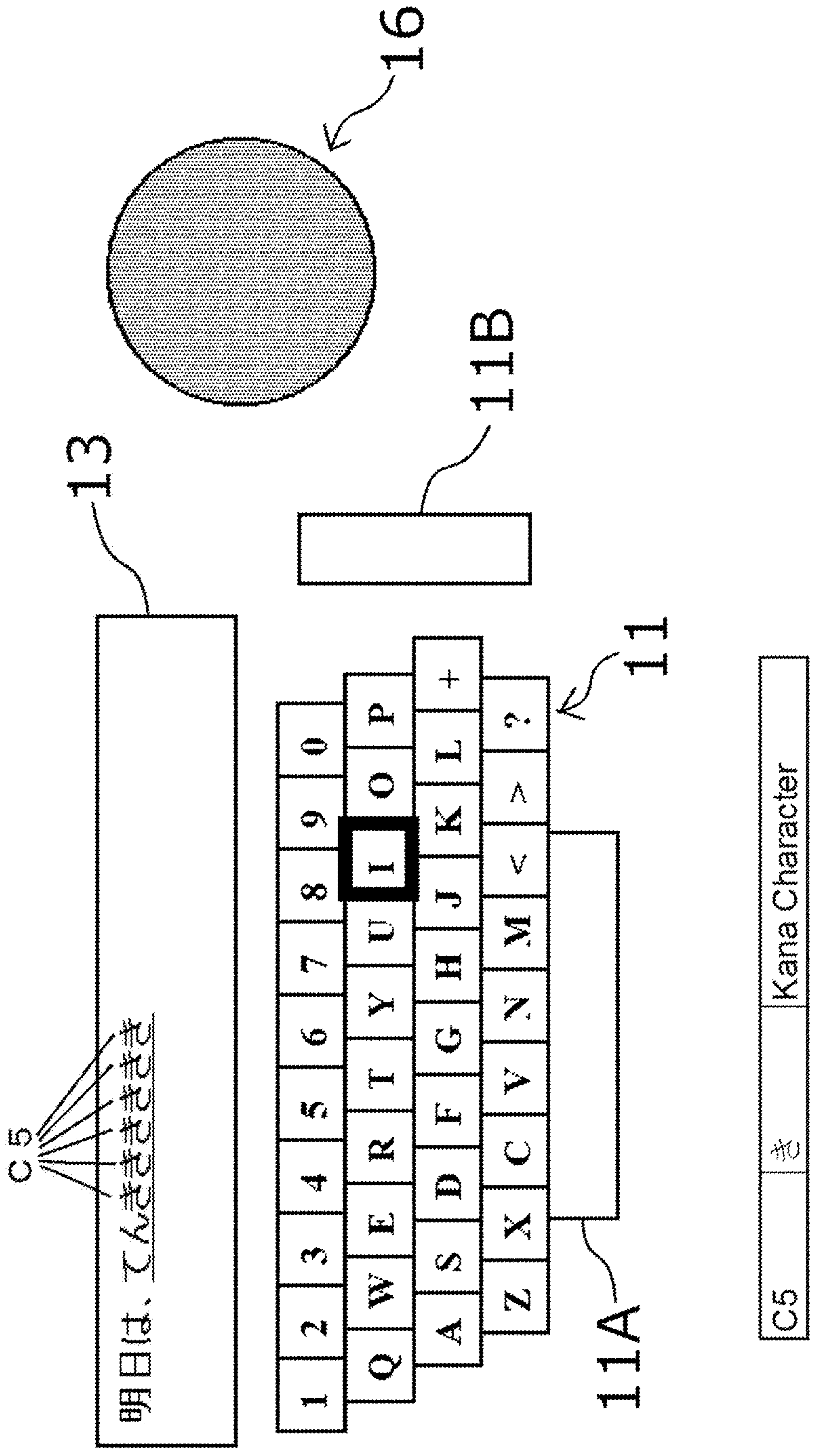
Figure 4F:
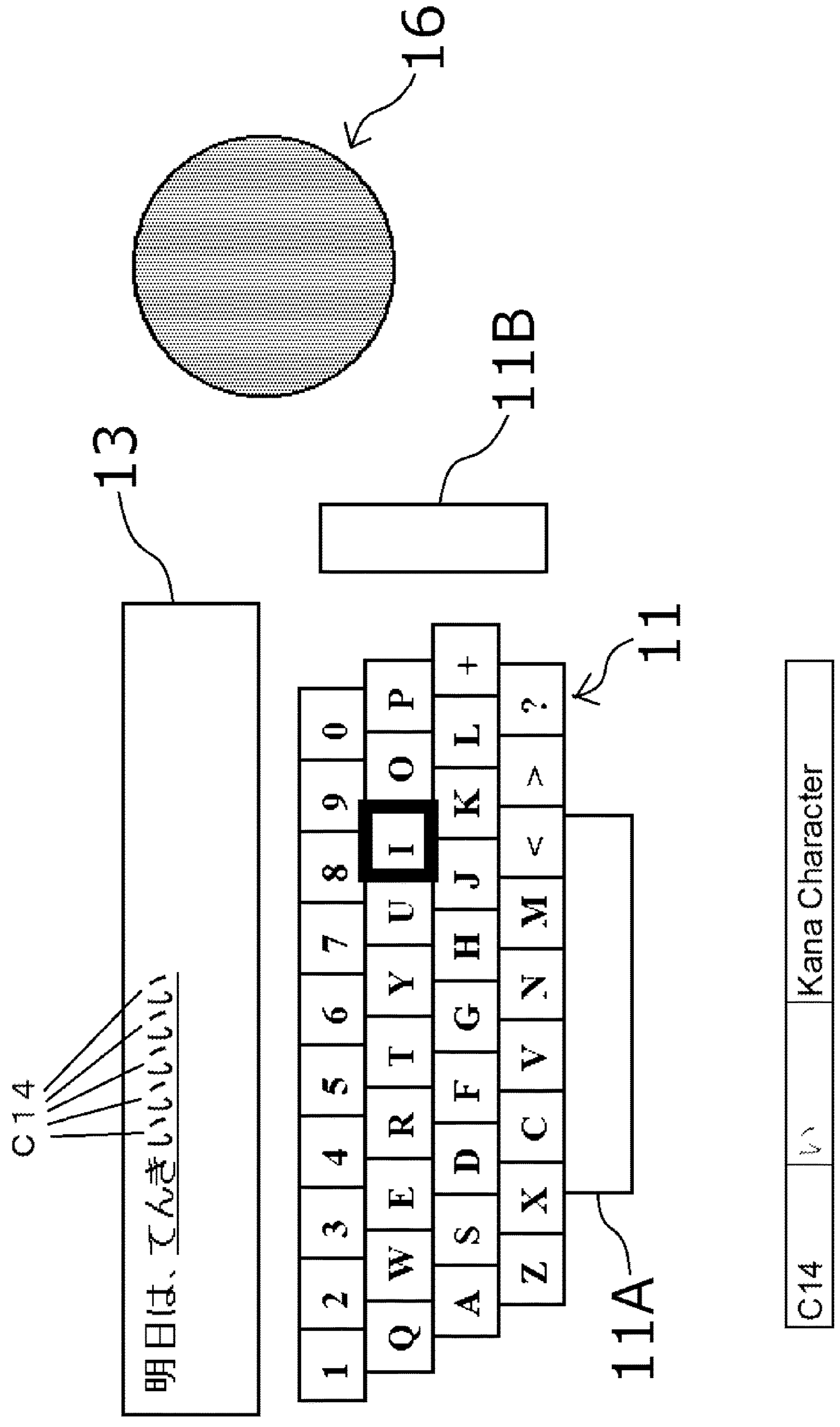

Meanwhile, FIG. 4E illustrates a behavior (third behavior) when the second timing is not detected after the elapsed time from the first timing exceeds the standby time. In this case, similarly to the case of FIG. 4C, the control unit 10 outputs the kana character (C5), which is the converted kana character of "K" and "I," and simultaneously outputs the kana character (C5) at a constant interval. That is, in this case, outputs similar to when the kana character (C5) is consecutively input are made. When the user releases his finger from the key "I" and the second timing is detected thereafter, a tentative display of the kana characters (C5) consecutively input is made as illustrated in FIG. 4E. It should be noted that, as illustrated in FIG. 4F, the character repeatedly output after outputting the kana character (C5) after converting "K" and "I" may be set to a kana character (C14) corresponding to "I" instead of the kana character (C5). Such a setting can be made by the user.

Switching of the conversion behaviors as described above is determined depending on a proportion of the elapsed time from the first timing with respect to the standby time. This standby time or an elapsed time necessary for the behavior in FIG. 4D to be caused is preferred to be long enough for the user to be able to set the second timing corresponding to which behavior described above is desired. Meanwhile, when this time is long, causing the behaviors in FIGS. 4D and 4E takes long time, and thus, there may be a case where inputting characters takes long time. Therefore, this standby time can be set to, for example, a few second.

It should be noted that when a kanji character conversion is performed from the state in FIG. 4C to as illustrated in FIG. 4D, similarly to the case in FIGS. 3A to 3D, it is only necessary to operate on the conversion key 11A.

Thus, this input accepting device 1 ensures similarly performing the behavior that has been performed in the typical input accepting device with less practical operations by the user. Appropriately setting the above-described standby time and the elapsed time until switching of the behaviors is performed ensures shortening the time that takes until all the character input is confirmed. In view of this, inputting characters can be efficiently performed. In this respect, using the display 13 and the elapsed time display 16 as described above reduces improper operations by the user.

Figure 5:
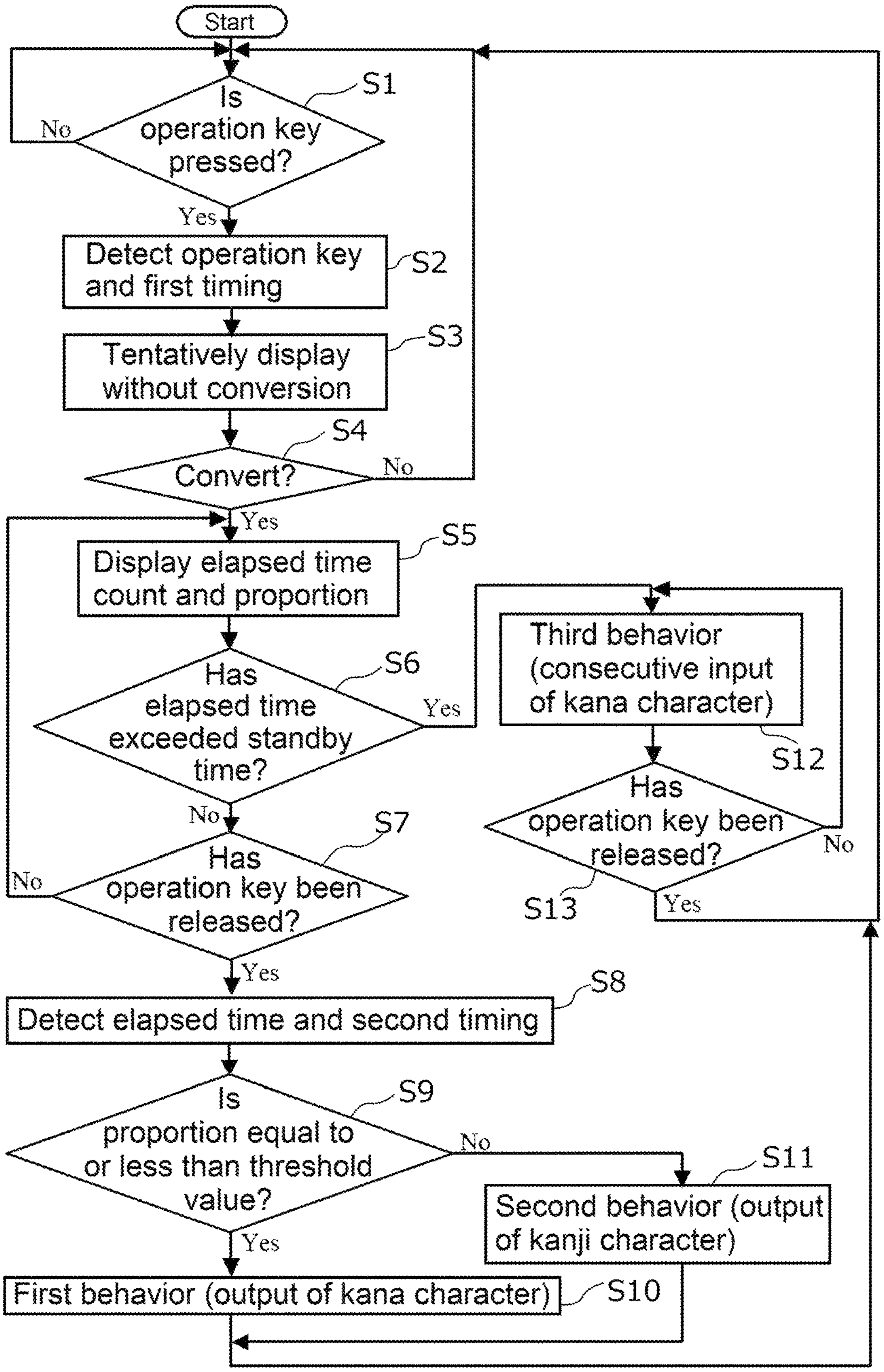
FIG. 5 illustrates a behavior in the input accepting device according to the one embodiment.

FIG. 5 illustrates a behavior of the control unit 10 at this time. This behavior is performed every time an operation on the operation key is performed (Step S1). Here, the operation on the operation key is performed means one certain operation key is pressed or touched when this operation key is on a touch panel. This causes the control unit 10 to detect which operation key is operated and detect this time point (first timing) using the input signal processing unit 12 (Step S2). It should be noted that, at this time, there is a case where two operation keys being simultaneously operated, such as a combination of a shift key and a key "A," is regarded as one operation. In this case, the timing at which one operation key (key "A" in this case) is operated can be the first timing.

Then, as illustrated in FIG. 4A, the control unit 10 causes the display 13 to output the character ("i" in FIG. 4B) corresponding to this operation key (Step S3). Since it is unconfirmed at this stage, the character is displayed similarly to the unconfirmed characters therebefore with the underline or a character decoration. Next, the control unit 10 determines whether a conversion is necessary or not upon this character input at this point (Step S4). This determination is made such that, for example, when the input character is a vowel, the conversion is needed by combining the vowel with the unconfirmed consonant character immediately before, and when the input character is a consonant, the conversion is not made, and the character is kept unconfirmed as it is. When the conversion is not needed (Step S4: No), the control unit 10 stands by for the next operation (Step S1).

When the conversion is needed (Step S4: Yes), the timer 15 counts the elapsed time from the first timing, and until the input signal processing unit 12 detects that the user's finger is released from the operated operation key (Step S7: Yes) while this elapsed time does not exceed the standby time (Step S6: No), the elapsed time display 16 displays the progress status in a proportion as described above (Step S5).

When it is detected that the user's finger is released from the operation key (Step S7: Yes), this time point is detected as the second timing, and a proportion of the elapsed time with respect to the standby time at this time point is detected (Step S8). Conversion processing performed after this is performed depending on a magnitude relationship between a preliminarily set threshold value and this proportion (Step S9). When this proportion is equal to or less than the threshold value (Step S9: Yes), the control unit 10 performs the conversion behavior (first conversion behavior) illustrated in FIG. 4C (Step S10), and causes the result to be displayed (tentatively displayed) on the display 13. When this proportion exceeds the threshold value (Step S9: No), the control unit 10 performs the conversion behavior (second conversion behavior) illustrated in FIG. 4D (Step S11), and causes the result to be similarly displayed on the display 13. Both cases terminate the conversion behaviors here, and the control unit 10 stands by for the next operation (Step S1).

Meanwhile, when the elapsed time exceeds the standby time before the finger is released from the operation key (Step S6: Yes), from the time point at which the elapsed time exceeds the standby time, the behavior (third behavior) that periodically outputs the character similar to the character in FIG. 4B is performed as illustrated in FIG. 4E (Step S12). This behavior is repeated until it is detected that the finger is released from the operation key (Step S13: Yes). When it is detected that the finger is released from the operation key (Step S13: Yes), the control unit 10 stands by for the next operation (Step S1) similarly to the case when another conversion behavior is performed.

While in the above-described example, the keyboard 11 is a keyboard of a romaji input method for Japanese characters, when the conversion behaviors are similarly performed on another language or a keyboard of another input method, the disclosure is applicable while these conversion behaviors are caused. For example, when English is input, an uppercase/lowercase conversion (first conversion behavior) can be performed instead of the above-described kana character conversion in FIG. 4C, and then, a conversion (second conversion behavior) that, for example, further inserts a blank after (or before) a word after the above-described uppercase/lowercase conversion can be performed instead of the kanji character conversion in FIG. 4D. In the uppercase/lowercase conversion, candidate synonyms may be displayed. Thus, the above-described configuration is applicable to another case besides the case of Japanese input by setting the conversion content corresponding to characteristics of the language.

While in the above-described example, the keyboard 11, the display 13, and the elapsed time display 16 are in physically separate bodies, for example, when a touch panel display on which the keyboard 11, the display 13, and the elapsed time display 16 are integrated is used and each of the operation keys are small and densely positioned, as typified by a portable terminal, a frequency of the improper operation by the user is high. Therefore, the above-described configuration that ensures inputting characters with less count of operations by the user is effective.

While in the above-described example, the elapsed time display 16 that displays the elapsed time in a pie chart is used, another visual display method may be used, for example, an image of an hourglass may be displayed. Alternatively, not such a visual display, for example, a beep sound in a small sound volume may be used.

Exemplary Embodiment of Disclosure

In the input accepting device of the disclosure, a plurality of operation keys corresponding to respective different characters are located, the operation keys being operated by a user inputs a character, and a conversion behavior that converts a combination of characters corresponding to the operation keys sequentially operated into another character or word is performed. The input accepting device includes an operation key state detection unit, a timer, and a conversion control unit. The operation key state detection unit detects a first timing and a second timing at which the user operates the operation key. The first timing is at which a state of the user becomes a state of touching the operation key from a state of not touching the operation key to. The second timing is at which a state of the user becomes a state of not touching the operation key after the first timing. The timer detects an elapsed time from the first timing. The conversion control unit causes the conversion behaviors with different contents depending on the elapsed time at the second timing.

The input accepting device of the disclosure includes an elapsed time display that displays the elapsed time after the first timing.

In the input accepting device of the disclosure, the conversion control unit switches and performs a first conversion behavior and a second conversion behavior. The first conversion behavior is switched and performed when a proportion of the elapsed time with respect to a preliminarily set standby time is small at the second timing. The second conversion behavior is switched and performed when the proportion is large. In the input accepting device of the disclosure, the elapsed time display displays the proportion.

In the input accepting device of the disclosure, the operation keys in a romaji input method is used to input Japanese. The conversion control unit, when the operation key corresponding to a vowel is operated while operations on the operation keys corresponding to a consonant and the operation key corresponding to the vowel are sequentially performed, at the second timing, performs: a behavior to convert a combination of the consonant and the vowel into a kana character as the first conversion behavior; and a behavior to further convert the kana character converted from the combination of the consonant and the vowel into a kanji character as the second conversion behavior.

In the input accepting device of the disclosure, the conversion control unit causes a kana character corresponding to a combination of the vowel and the consonant or a kana character corresponding to the vowel to be output at a constant interval. The outputting is performed after the first conversion behavior is performed when the second timing is not detected even after the elapsed time exceeds the standby time.

In the input accepting device of the disclosure, the operation keys in a romaji input method is used to input English. The conversion control unit, at the second timing, performs: an uppercase/lowercase conversion as the first conversion behavior; and a behavior that inserts a blank before or after a word after the uppercase/lowercase conversion after the uppercase/lowercase conversion is performed, as the second conversion behavior.

Effect of Disclosure

The above-described configuration ensures achieving a quick operation while reducing an improper operation on operation keys by a user.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An input accepting device comprising:

a control unit constituted by a CPU;

a plurality of operation keys corresponding to characters that differ from each other;

an input signal processor connected to the control unit and to the plurality of operation keys, for receiving input of characters through user operation of the operation keys and accordingly determining, and transmitting to the control unit, which operation key is operated, thereby causing the control unit to detect user-input character content;

a display connected to the control unit, for displaying the characters detected by the control unit;

as functionality of the control unit, a converting unit for converting a combination of characters, corresponding to sequentially operated keys among the plurality of operation keys, into another character or word;

electrical switches connected to the plurality of operation keys and to the control unit, the electrical switches therein constituting an operation-key state detection unit for detecting, when a user is operating the plurality of operation keys, a first point at which a state where a user is not touching an operation key turns into a state where the user has touched an operation key, and a second point at which the state after the first point turns into the user not touching the operation key;

a timer connected to the control unit, for detecting elapsed time from the first point with respect to a preliminarily set standby time;

as functionality of the control unit, a conversion control unit for alternatingly causing the converting unit to convert the combination of characters corresponding to the sequentially operated keys according to a first conversion action when the elapsed time at the second point is a predetermined first proportion of the standby time, and causing the converting unit to convert the combination of characters corresponding to the sequentially operated keys according to a second conversion action when the elapsed time at the second point is a predetermined second proportion, greater than the first proportion, of the standby time; and an elapsed-time display for proportionally indicating time elapsed from the first point relative to the standby time, in the form of a pie chart whose full area represents the standby time, to indicate the first proportion and the second proportion of the standby time.

2. The input accepting device according to claim 1, wherein:

the plurality of operation keys includes operation keys in a romaji input method utilizing Japanese input; and in an instance where operations on an operation key corresponding to a consonant and an operation key corresponding to a vowel are sequentially performed, when the operation key corresponding to the vowel is operated, at the second point the conversion control unit performs an action to convert a combination of the consonant and the vowel into a kana character as the first conversion action, and an action to further convert the kana character converted from the combination of the consonant and the vowel into a kanji character as the second conversion action.

3. The input accepting device according to claim 2, wherein the conversion control unit causes a kana character corresponding to a combination of the vowel and the consonant or a kana character corresponding to the vowel to be output at a constant interval, the outputting being performed after the first conversion action is performed when the second point is not detected even after the elapsed time exceeds the standby time.

4. The input accepting device according to claim 1, wherein:

the plurality of operation keys includes operation keys in a romaji input method utilizing English input; and the conversion control unit, at the second point, performs an uppercase/lowercase conversion as the first conversion action, and an action that inserts a blank before or after a word after the uppercase/lowercase conversion is performed, as the second conversion action.

* * * * *